United States Patent [19]

Hanni et al.

[11] 4,109,298
[45] Aug. 22, 1978

[54] CONNECTOR WITH PRINTED WIRING BOARD STRUCTURE

[75] Inventors: Stephen L. Hanni, Richardson; Dudley B. Johnson, Irving, both of Tex.

[73] Assignee: Texas Instruments Incorporated, Dallas, Tex.

[21] Appl. No.: 708,502

[22] Filed: Jul. 26, 1976

[51] Int. Cl.² ............................................. H05K 1/04
[52] U.S. Cl. .................................. 361/412; 174/68.5
[58] Field of Search .............................. 361/412, 406; 339/176 MP, 17 L, 17 LM, 17 LC, 17 M; 174/68.5

[56] References Cited

U.S. PATENT DOCUMENTS

| | | | |
|---|---|---|---|
| 2,433,384 | 12/1947 | McLarn | 361/406 |
| 2,707,272 | 4/1955 | Blitz | 339/17 LM |
| 2,869,040 | 1/1959 | Pifer | 361/406 |
| 2,876,390 | 3/1959 | Sanders, Jr. | 361/412 |
| 2,910,628 | 10/1959 | Keener | 361/412 |
| 3,296,099 | 1/1967 | Dinella | 174/68.5 |
| 3,601,522 | 8/1971 | Lynch | 174/68.5 |

FOREIGN PATENT DOCUMENTS 2,013,258  10/1971  Fed. Rep. of Germany ...... 339/17 LC

*Primary Examiner*—David Smith, Jr.
*Attorney, Agent, or Firm*—Richard P. Berg; Rene' E. Grossman

[57] ABSTRACT

An improved connector having a printed wiring board structure and integrally connected to a printed wiring board. The connectors are suitable for use as part of a printed wiring board having a metal substrate. The connectors are finger-like structures, which mate either with other finger-like structures or with apertures in a printed wiring board. Both soldered and solderless connectors are disclosed.

10 Claims, 21 Drawing Figures

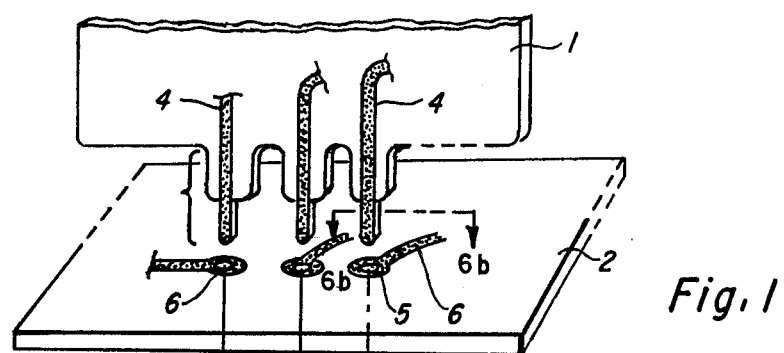
Fig. 1
Fig. 1a
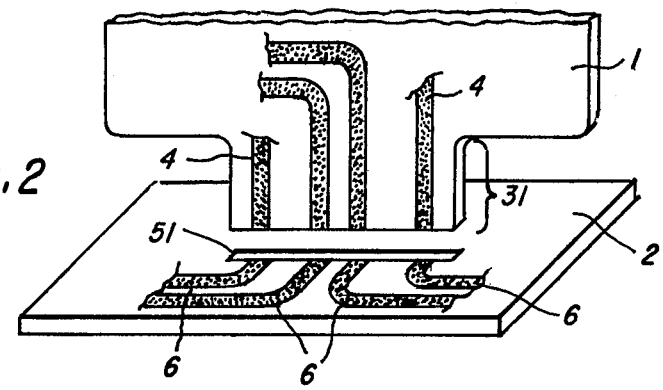
Fig. 2

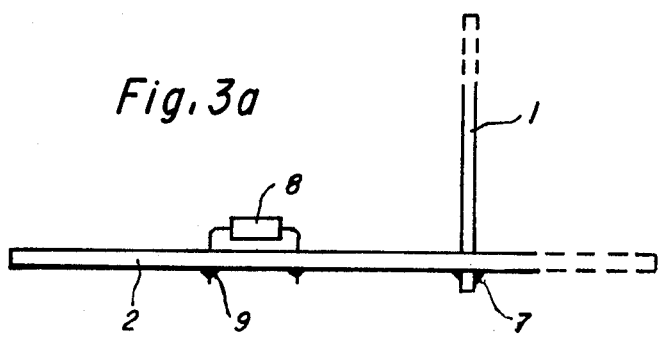
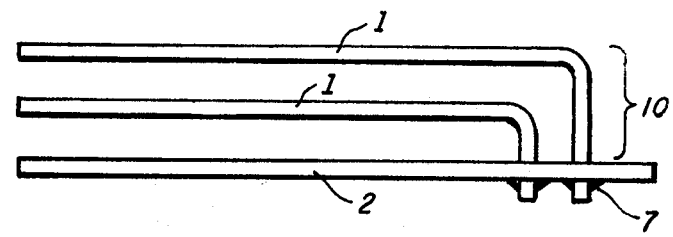
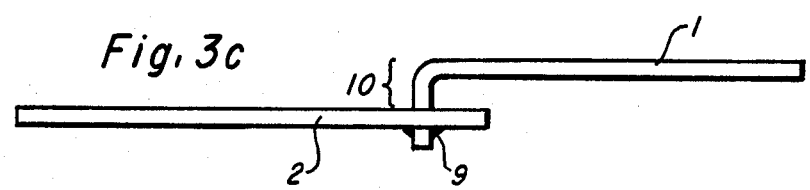
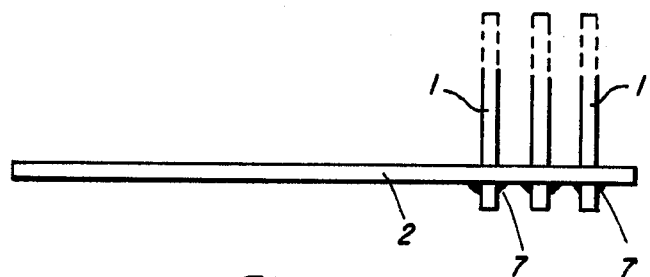
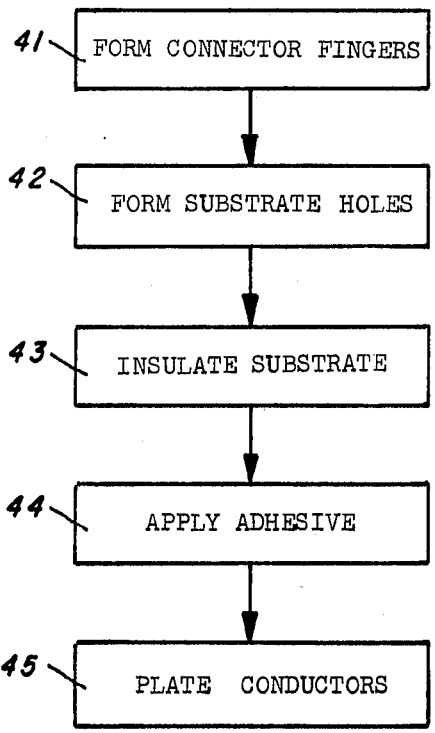

CONNECTOR WITH PRINTED WIRING BOARD STRUCTURE

BACKGROUND OF THE INVENTION

This invention relates to connectors used in printed wiring boards and, more specifically, to connectors having printed wiring board structure and which may be integrally connected to a printed wiring broad.

Printed wiring boards have been widely used throughout the electronics industry because of their increased reliability and decreased cost compared to hand wiring techniques. In certain applications, it is desirable to have printed wiring board disposed adjacent to each other with interconnections between the printed wiring boards. In the prior art, these interconnections have been effected using wiring harnesses, lead frames, stitch wires or electrical plug assemblies. These prior art interconnections have been either expensive (e.g., plug assemblies) or required the use of components which are relatively time consuming and, thus, expensive to install (e.g., harnesses and lead frames).

It is, therefore, one object of this invention to improve printed wiring board connections.

It is another object of this invention to produce a connector which is manufactured integrally with a printed wiring board.

It is yet another object of this invention to produce a printed wiring board connector which may be utilized at a generally lower cost than the connectors of the prior art.

The foregoing objects are achieved as is now described. Briefly, in accordance with the invention described, soldered and solderless connectors are formed integrally with a printed wiring board during the course of the manufacture of the printed wiring board, thereby simplifying the manufacture of printed wiring boards having connectors. Generally, in accordance with one embodiment herein described, a substrate is punched from sheet metal, the substrate generally having the shape of a printed wiring board, but with finger-like structures radiating from what would be the normal edge of the printed wiring board. This substrate is coated with an insulating material and conductors are formed on the insulated substrate including the printed wiring board portion and the insulated finger-like structure portion. The insulated finger-like structures, with conductors affixed thereto, may be bent to a desired shape to form a solderless connector or may be used generally as is to form a soldered connector. The connector with which the above-described connectors mate is generally manufactures according to a similar process; however, the connector may take the form of either finger-like structures which make connection with the aforementioned finger-like structures or may take the form of apertures in a printed wiring board into which the aforementioned finger-like structures are inserted.

The aforementioned objects and other objects and features are evident from the following detailed description and claims with reference to the drawings in which:

FIG. 1 is an exploded, perspective view of one embodiment of the soldered connector;

FIG. 1a shows an embodiment of the soldered connector having two separate conductors on opposite sides of a single soldered connector;

FIG. 2 shows an embodiment of a soldered connector having two or more conductors on a single side of one connector;

FIGS. 3a–3d are side views of two mated printed wiring boards using a soldered connector;

FIG. 4 is a block diagram representation of the method of manufacturing a printed wiring board with integral connectors;

DETAILED DESCRIPTION OF SOLDERED CONNECTORS

Figure 5A:
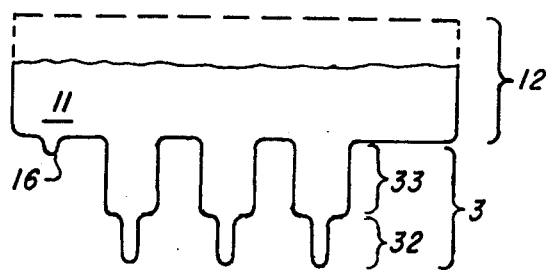
FIGS. 5a–5e depict a printed wiring board with a plurality of conductors at various steps during the manufacturing process.

Referring now to FIG. 1, there is shown an exploded, perspective view of a first printed wiring board 1 about to be mated with a second printed wiring board 2. The first printed wiring board 1 has a plurality of finger-like projections forming connectors 3 which extend outwardly from the plane of the first printed wiring board 1 and which mate with apertures 5 in a second printed wiring board 2. Preferably, each finger-like connector has one conductor 4 associated with it, and similarly, each aperture 5 has one conductor 6 associated with it. We have determined, however, that separate conductors e.g., two or more conductors 4, may be applied to the major surfaces of printed wiring board 1 and connector 3, and, similarly, the conductor 6 associated with each aperture 5 may be split into two or more conductors e.g., 61 and 62, as shown in FIG. 1a. After joining the finger-like connectors 3 with apertures 5, solder 7 may be used to assure a good electrical connection (FIG. 3a).

FIG. 2 depicts another embodiment of a soldered connector. In FIG. 2 there is shown first printed wiring board 1 mating with second printed wiring board 2, similar to that shown in FIG. 1. However, the finger-like structure extending from printed wiring board 1 is much broader than finger-like connectors 3 shown in FIG. 1. This broadened connector 31 is sufficiently broad to accommodate a plurality of conductors for one major plane of printed wiring board 1. An aperture 51 in printed wiring board 2 forms an elongated slot for receiving broadened connector structure 31.

FIG. 3a generally shows a side view of the first printed wiring board 1 mating with a second printed wiring board 2. The connector embodiments of FIG. 1, 1a, and 2 all appear to be generally the same when viewed from the side, so those different embodiments are not identified in FIGS. 3a–3d. Printed wiring board 2 is shown with a typical electrical component 8 (such as a resistor), connected by soldered fillet 9 to conductors 4 (FIGS. 1 and 2) formed on the upper and/or lower major surfaces of printed wiring board 2. Methods of attaching and soldering such electrical components are well known in the art. Conductors 4 (FIGS. 1 and 2) formed on printed wiring board 1 are connected to conductors 6, 61 or 62 (FIGS. 1, 1a and 2) formed on printed wiring board 2 by means of soldered fillets 7, preferably disposed on the side of printed wiring board 2 opposite from which the connector 3 or 31 of printed wiring board 1 entered printed wiring board 2. It is evident, however, that soldered fillets 7 may be disposed on the same side (or both sides) of printed wiring board 2 which connectors 3 or 31 entered. We have shown in FIG. 3a the soldered fillet 7 being located on the same side of printed wiring board 2 as soldered fillets 9 (being the side opposite from connector entry) as we consider this the more readily accomplished and therefore, the preferrable mode of practicing our invention. FIGS. 3b–3d are similar to FIG. 3a except that in FIGS. 3b and 3c, the first printed wiring board 1 is shown with an angled member 10 which is advantageously used to increase the density of printed wiring boards in a limited amount of space. In FIGS. 3b and 3d there are also shown a plurality of first printed wiring boards 1 intersecting second printed wiring board 2 which can be similarly advantageously used to increase the density of printed wiring boards in a limited space.

In the foregoing description, we have described the general shape and character of our soldered connection and further explained how it may be advantageously utilized to interconnect a plurality of printed wiring boards. These connectors are preferably manufactured during the manufacture of an associated printed wiring board having a metal substrate. The structure and method of manufacturing these soldered connectors will now be explained in greater detail.

Referring now to FIG. 5a, there is shown a metal substrate 11 having three finger-like connectors 3 which project from the area of the metal substrate 11 which will form the usual portion 12 of the printed wiring board, which usual portion 12 is normally used for carrying components 8. The connectors 3 are shown with wide portions 33 and narrow portions 32. The narrow portions 32 are the portions which will eventually mate with the second printed wiring board 2 (FIG. 1). While it is not necessary that connector 3 be provided with wide portion 33, we prefer to incorporate such a wide portion 33 to reduce the stresses which occur at the junction of connector 3 and printed wiring board portion 12, when the mated wiring boards are flexed. Connector portions 32 are preferrably formed having a lenght of 0.09 inch and a breadth of 0.035 inch. However, the length and breadth of connector portion 32 may be varied over a wide range of dimensions which will work equally well. Similarly, it has been found that the length and breadth of portion 33 of connector 3 are also not critical. We have found that a connector portion 33 having a breadth of 0.06 inch and a length of 0.08 inch yields satisfactory results. The connectors 3 may be deployed either individually or in a series. If the series of connectors 3 are used, we have found that the centers of the fingers 3 should be at least on approximately 0.1 inch centers. If the conductors are to be used on smaller centers, we find it preferably to utilize the embodiment depicted in FIG. 2.

The substrate 11 for connectors 3 and printed wiring board 1 may be formed from sheet metal by a variety of methods, such as notching or milling. However, we find it preferably to use a blanking press to form a substrate for the connectors 3. The metal substrate 11 material may be sheet steel, copper, or aluminum or alloys thereof, and may have a thickness of 5 to 100 mils; we find it preferably, however, to use a metal substrate 11 of sheet steel having a thickness of 15 to 30 mils.

Figure 6A:
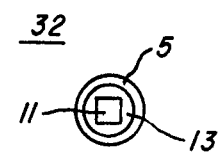
FIGS. 6a–6b are sectional views through a connector.
Figure 6B:
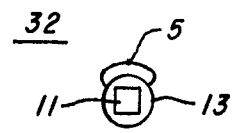

Referring now to FIG. 4, there is depicted, in a block diagram representation, the method of manufacturing the soldered connectors. At step 41, the finger connectors are formed by blanking as aforementioned. At step 42, apertures 5 (FIG. 1) or elongated apertures 51 (FIG. 2) are formed in second printed wiring board 2, for instance, by blanking, piercing or drilling the metal substrate 11. As is shown in FIGS. 6a and 6b, the size of the apertures 5 or elongated apertures 51 are preferably selected to accommodate not only the size of the metal substrate in the connector portion 32 (FIG. 5a) or the broadened connector 31 (FIG. 2), but also to accommodate the thicknesses of the insulating layers 13 which are applied to metal substrate 11 and also of the metal conductors 4 (FIG. 1) which are affixed to insulating layer 13 at connectors 3 or 31. According to step 43, the first and second printed wiring board substrates 11 have insulating layer 13 affixed thereto to insulate substrates 11 from the printed wiring board conductors 4 and 6. If the printed wiring board is to be bent, for instance, as is shown in FIGS. 3b and 3c, the insulating layer, as well as the metal substrate 11, must have sufficient ductility to withstand forming operations occuring after the insulating layer has been affixed.

U.S. patent application Ser. No. 667,333, filed Mar. 16, 1976, now U.S. Pat. No. 4,074,419, and assigned to the assignee of this invention discloses a method of manufacturing metal substrate printed wiring boards with angled members, the substrates of which are isolated by an electrostatically applied insulating layer and the conductors of which are electrolessly applied to an adhesive layer affixed to the insulating layer. It has been found that utilizing the method and materials disclosed in U.S. patent application Ser. No. 667,333 now U.S. Pat. No. 4,074,419 for bulk or individually cleaning the substrate, applying the insulating layer 13 (step 43, FIG. 4), selectively screening an adhesive layer onto insulated substrate 11 (step 44, FIG. 4), forming conductors 4 and 6 on the adhesive-coated insulated substrate 11 (step 45, FIG. 4) and in bending the resulting printed wiring board (if bent at all) yields satisfactory results.

Figure 5B:
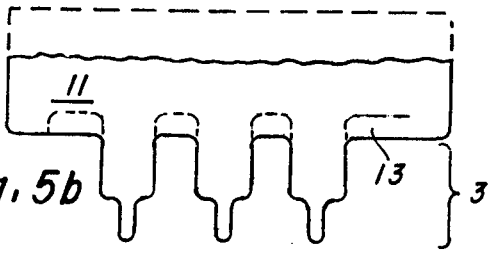
Figure 5C:
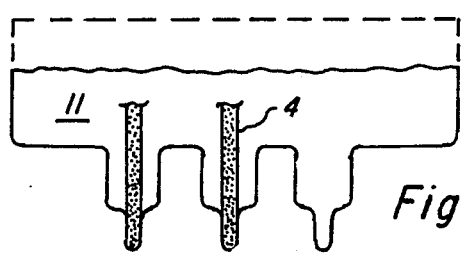

Referring now to FIG. 5b, there is shown a metal substrate of FIG. 5a with a layer of insulating material 13 covering substrate 11. As is shown in FIG. 5b, the insulating layer 13 tends to fill the gap between broadened sections 33 of connectors 3. The insulating layer may be applied in accordance with the aforementioned U.S. patent application Ser. No. 667,333 now U.S. Pat. No. 4,074,419 (which in turn references U.S. Pat. No. 3,934,334 for electrostratically applying the insulating layer 13). In FIG. 5c, there is shown the insulated finger connectors of FIG. 5b with conductors 4 affixed to the insulated substrate 11. As aforementioned, these conductors are preferably applied to an adhesive which has been screened on selected areas of the insulated substrate as disclosed in U.S. patent application Ser. No. 667,333 now U.S. Pat. No. 4,074,419 (FIG. 4, steps 44 and 45). A sectional view through a connector finger portion 33 formed in accordance with this preferred method is shown in FIG. 6b. Alternatively, the conductors 4 or 6 may be formed on insulated substrate 11 by screening the adhesive onto substantially the entire area of the insulated substrate 11 and then screening on a plating resist in those areas where conductors are desired not to be formed, in accordance with the methods disclosed in U.S. Pat. No. 3,934,334. A section revealed through a finger portion 32 formed in accordance with this alternate method is shown in FIG. 6a; an elevation view is shown in FIG. 5d.

Figure 5D:
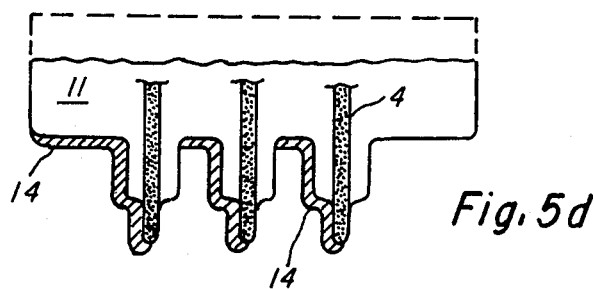
Figure 5E:
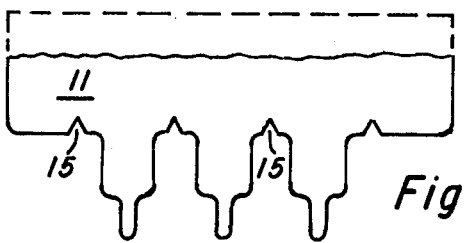

FIGS. 5c and 5d differ in that a strip of conducting material 14, shown in FIG. 5d, plates on the edge of the insulated substrate, tending to short out the neighboring connectors 3. This conductive strip 14 results because of the difficulty in applying plating resists along the edges of the insulated substrate 11. In order to isolate the conductors one from another, an insulating notch 15 may be cut between the various connectors, if this alternate method of U.S. Pat. No. 3,934,334 is utilized. Protuberance 16 in metal substrate 11 (FIG. 5a) and the stress relief notches formed by connector portions 33 provide support to permit the insulating layer 13 to overhang the metal substrate a distance approximately equal to the distance between portions 33 or between protuberance 16 and portion 33. This overhang then provides space for cutting through the strip of conducting material 14 when cutting into the insulating layer 13 when forming notches 15 without exposing the underlying metal substrate 11. We prefer to use the method wherein the adhesive is selectively applied to eliminate any need for having to form the protuberance 16, the insulating notch 15 or similar isolating barrier between the various finger connectors 3. Methods and materials for applying insulating layer, adhesive, plating resist (if used) and conductors are disclosed in U.S. Pat. No. 3,934,334 or U.S. patent application Ser. No. 667,333 now U.S. Pat. No. 4,074,419.

The second printed wiring board 2 (FIG. 1) is manufactured according to a similar process, e.g., the metal substrate 11 is cleaned, covered with an insulating layer, and deposited with conductors in accordance with the aforementioned application and U.S. Patent. If the adhesive is applied by the aforementioned screening process, the adhesive can be made to more readily enter the interior surface of aperture 5 or 51 if a slight vacuum is applied to one side of insulated substrate 11 during or shortly after application of the adhesive. If the method of U.S. Pat. No. 3,934,334 is used, then the adhesive tends, naturally, to coat the interior walls of apertures 5 or 51.

If a printed wiring board including connector is to be disposed into different planes, as depicted in FIGS. 3b and 3c, then the insulated substrate is bent to take the desired shape. Pending U.S. patent application Ser. No. 667,333 now U.S. Pat. No. 4,074,419 discloses the method of bending insulated metal substrate printed wiring boards. This method is satisfactory for bending the connectors or printed circuit board portion 12 of this invention.

Having formed both the connectors 3 and connector receiving apertures 5 in printed wiring boards, the printed wiring boards may be stored for later assembly. Upon assembly, the boards are preferably cleaned to remove any oxidation from the conductors, the boards mated and the interconnections soldered by well-known soldering techniques, such as hand or wave soldering.

DETAILED DESCRIPTION OF SOLDERLESS CONNECTORS

FIGS. 7a-7e depict several embodiments of solderless connectors formed integrally with a printed wiring board. These embodiments of our solderless connectors share a point of commonality in that they all require that one or both of the mating connectors include a bend in the substrate 11. As disclosed in copending patent application Ser. No. 667,333, now U.S. Pat. No. 4,074,419 bends having a radius of less than approximately 0.25 inch can be most easily formed if the bending is accomplished before the conductors are plated on the insulated substrate. It should be noted that FIGS. 7a, 7d and 7f utilize small-radius bends which are preferably formed after the adhesive layer and plating resists (if used) have been applied to the insulated substrate, thereby permitting the imaging operations, e.g., screen printing, to occur while the substrate is still in a planar configuration. The insulated substrate, after application of the adhesive and plating resists (if used), may then be formed by conventional processes, and the bends, may have radii as small as 0.01 inch. U.S. patent application Ser. No. 667,333 now U.S. Pat. No. 4,074,419 discloses methods and materials suitable for obtaining such small radius bends.

Figure 7A:
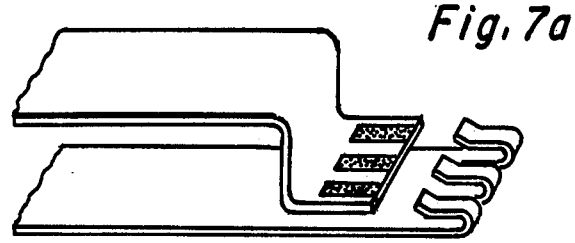
FIGS. 7a–7f are various embodiments of solderless connectors.
Figure 7B:
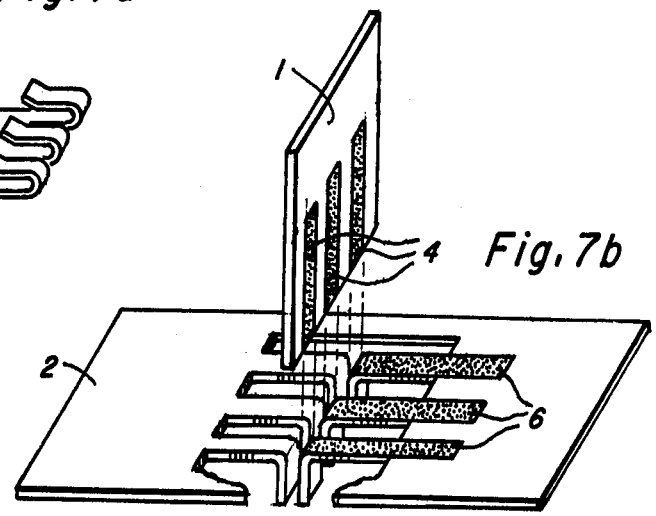
Figure 7C:
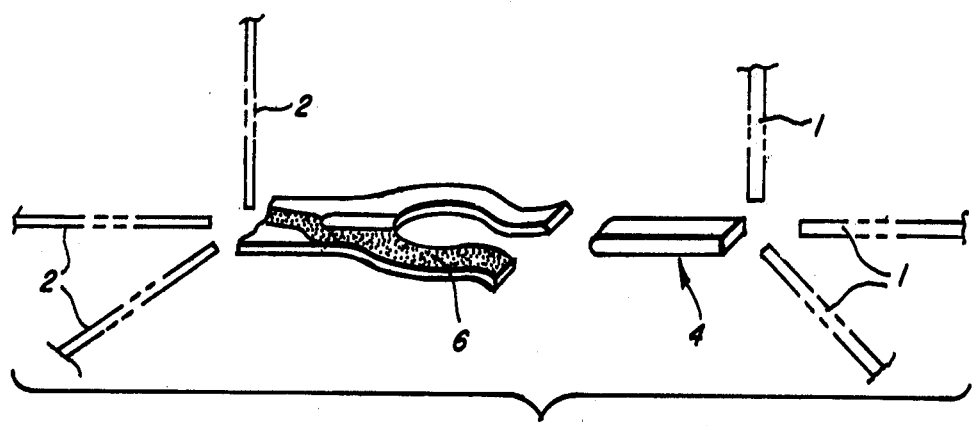
Figure 7E:
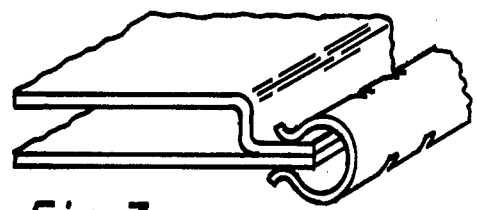
Figure 7D:
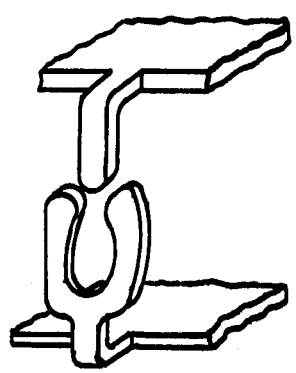
Figure 7F:
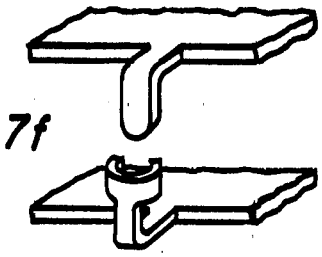

The connectors shown in FIGS. 7a-7f are formed in accordance with the processes hereinbefore discussed with respect to a soldered connector, the geometry of the finger connectors being altered to correspond to that shown in FIGS. 7a-7d and 7f. FIG. 7e discloses a connector utilizing an external retainer 14, which keeps the adjacent connector on the circuit boards in electrical contact. As is well known in the art, the copper tends to oxidize; thus does not perform well in applications where the oxidation may degrade the electrical connection of a mechanical joint such as those shown in FIGS. 7a-7f. Therefore, the solderless connectors shown in FIGS. 7a-7f, in addition to having a copper conductor deposit at the point of contact, also have nickel boron or nickel or gold deposited over the contact areas to inhibit the degrading effects of oxidation of contacting metals. Methods for plating nickel, nickel boron, and gold are well known to those trained in the art.

Having described the invention in connection with certain specific embodiments thereof, it is to be understood that further modification may now suggest itself to those skilled in the art. It is to be understood that the invention is not to be limited to the specific embodiments thereof except as set forth in the appended claims.

What is claimed is:

1. A printed wiring board connector, comprising:
   (a) a first sheet metal substrate including at least two finger-like projections extending outwardly from the central portion of said first substrate;
   (b) a first layer of insulating material covering said first substrate including said finger-like projections and the peripheral edge of said sheet metal substrate, said insulating material further extending outwardly of said first substrate in the area between said at least two finger-like projections;
   (c) a first layer of conductive material affixed to selected areas of said first layer of insulating material and said at least two finger-like projections;
   (d) a second layer of conductive material affixed to said first layer of insulating material at the peripheral edge of said first sheet metal substrate, including the peripheral edge of the insulating material extending outwardly of the first substrate;
   (e) notch means for severing said second layer of conductive material between said at least two finger-like projections, said notch means confronting the insulating material extending outwardly of the first substrate;
   (f) a second substrate having at lest two apertures for receiving said at least two finger-like projections;
   (g) a second layer of insulating material covering, at least in part, said second substrate; and
   (h) a third layer of conductive material affixed to said second layer of insulating material covering at least part of the peripheral area of said apertures, for making electrical contact with said first layer of conductive material when said finger-like projections, are inserted into said apertures.

2. The connector according to claim 1, where said second substrate is sheet metal.

3. The connector according to claim 1, where said finger-like projections include first and second portions, the first portion being of greater cross-sectional area than the second portion.

4. The connector according to claim 3, wherein said second layer of insulating material covers the hole forming walls of said aperture in said second substrate and wherein said third layer of conductive meterial is affixed to said second layer of insulating material covering the hole forming walls of said aperture.

5. The connector according to claim 1, wherein said projections are of a sufficient width to accommodate a plurality of conductors formed by said first layer of conductive material, said plurality of conductors being disposed on a single major surface of said projection.

6. The connector according to claim 1, wherein said first layer of conductive material is affixed to one major surface of said first layer of insulating material covering said substrate including finger-like projections and further including a fourth layer of conductive material affixed to another major surface of said first layer of insulating material.

7. The connector according to claim 6, wherein said third layer of conductive material is separated into two spaced apart portions each affixed to a selected portion of the peripheral area of said aperture.

8. The connector according to claim 1, further including:
(a) a third substrate having a finger-like projection extending outwardly from the central portion of said third substrate;
(b) a third layer of insulating material covering said third substrate including the finger-like projection eminating therefrom;
(c) a fourth layer of conductive material affixed to selected areas of said third layer of insulating material and said projection eminating from the central portion of said third substrate;
(d) wherein said second substrate includes another aperture for receiving the finger-like projection eminating from the central area of said third substrate; and
(e) wherein said finger-like projections eminating from the central portions of said first and third substrates are disposed in a plane essentially at a right angle to the plane of the major surface of said first and third substrates whereby the major planes of said first, second and third substrates are all disposed in essentially parallel planes when said finger-like projections are received in their respective apertures.

9. A printed wiring board connector comprising:

(a) a first substrate including at least two finger-like projections extending outwardly from the periphery of said first substrate;
(b) a first layer of conductive material affixed to said portions of said first substrate and said finger-like projections;
(c) a second substrate including at least two tined finger-like projections extending outwardly from the periphery of said second substrate, the tines thereof being adapted for receiving and grasping the finger-like projection of said first substrate; and
(d) a second layer of conductive material affixed to selected portions of said second substrate and to at least one of said tined finger-like projections and being adapted for forming a connection between said first and second layers of conductive material when said tines of said tined finger-like projections grasp said finger-like projections of said first substrate.

10. A printed wiring board connector, comprising:
(a) a first substrate including at least two finger-like projections extending outwardly from the central portion of said substrate;
(b) a first layer of insulating material covering, at least in part, said first substrate including said finger-like projections;
(c) a first layer of conductive material affixed to selected areas of said first layer of insulating material and said finger-like projections;
(d) a second substrate having at least two finger-like projections extending outwardly from the central portion of said second substrate;
(e) a second layer of insulating material covering, at least in part, said second substrate including the finger-like projections eminating therefrom;
(f) a second layer of conductive material affixed to selected areas of said second layer of insulating material and said projections eminating from the central portion of said second substrate;
(g) a third substrate having apertures for receiving the finger-like projections; from said first and second substrates;
(h) a third layer of insulating material covering, at least in part, said third substrate;
(i) a third layer of conductive material affixed to said third layer of insulating material covering at least part of the peripheral area of said apertures, for making electrical contact with said first and second layers of conductive material when said finger-like projections are inserted into said apertures; and
(j) wherein said finger-like projections eminating from the central portions of said first and third substrates are disposed in a plane essentially at a right angle to the plane of the major surface of said first and third substrates whereby the major planes of said first, second and third substrates are all disposed in essentially parallel planes when said finger-like projections are received in their respective apertures.

* * * * *